US006645810B2

(12) United States Patent
Ng et al.

(10) Patent No.: US 6,645,810 B2
(45) Date of Patent: Nov. 11, 2003

(54) METHOD TO FABRICATE MIM CAPACITOR USING DAMASCENE PROCESS

(75) Inventors: Chit Hwei Ng, Singapore (SG); Chaw Sing Ho, Singapore (SG)

(73) Assignees: Chartered Semiconductors Manufacturing Limited, Singapore (SG); Agilent Technologies Incorporated, Santa Clara, CA (US)

( * ) Notice: Subject to any disclaimer, the term of this patent is extended or adjusted under 35 U.S.C. 154(b) by 0 days.

(21) Appl. No.: 10/012,292

(22) Filed: Nov. 13, 2001

(65) Prior Publication Data
US 2003/0092259 A1 May 15, 2003

(51) Int. Cl.[7] ................. H01L 21/8242; H01L 21/20; H01L 21/4763
(52) U.S. Cl. .............. 438/253; 438/396; 438/622
(58) Field of Search ................ 438/239–242, 438/250–256, 393–399

(56) References Cited
U.S. PATENT DOCUMENTS
6,320,244 B1 * 11/2001 Alers et al. ................ 257/534

2002/0019123 A1 * 2/2002 Ma et al. .................... 438/622
2002/0074584 A1 * 6/2002 Yang .......................... 257/300
2002/0102809 A1 * 8/2002 Barth et al. ................ 438/393

* cited by examiner

Primary Examiner—John F. Niebling
Assistant Examiner—Jennifer M. Kennedy
(74) Attorney, Agent, or Firm—Wagner, Murabito & Hao LLP

(57) ABSTRACT

In one embodiment, the present invention recites forming a number of first openings in a first substrate. The present embodiment then recites forming a copper region within each first openings during a damascene process, wherein each copper region has a top surface. The present embodiment then disposes a dielectric layer proximate to the top surface of each of the first copper regions during the damascene process. After depositing a second substrate over the dielectric, a number of second openings in a second substrate are made. Next, a number of second copper regions are formed in the second openings, during the damascene process. The dielectric region is thus disposed between the first copper regions and the second copper regions. In so doing, the dielectric region forms a dielectric barrier between the first copper regions and the second copper regions such that a metal-insulator-metal (MIM) capacitor is formed during a damascene process.

13 Claims, 5 Drawing Sheets

300

```
┌─────────┐
│  Begin  │
└────┬────┘
     ▼
```

302
The Bottom MIM Capacitor Electrodes and Plates are Formed, Along With Other Interconnects in Dual Damascene Process

304
Remove the Excess Copper By Chemical Mechanical Polishing (CMP)

306
A High K Dielectric Material is Deposited Over the Copper Regions

308
The High K Dielectric is Masked and Patterned

310
A Low K Inter-Metal Dielectric Material is Deposited; Masking and Patterning is Done to Form the Top Capacitor Plates Simultaneously With the Other Interconnects

312
The Trends/Via Are Filled With a Barrier and Then With Copper

314
Chemical Mechanical Polishing is Done to Remove Excess Copper

316
The Circuit is Completed by Forming Interconnects or Links, Which Are Fabricated for Various Purposes in a Damascene Process

```
┌─────────┐
│   End   │
└─────────┘
```

FIG. 3

METHOD TO FABRICATE MIM CAPACITOR USING DAMASCENE PROCESS

FIELD OF THE INVENTION

The present claimed invention relates to the field of semiconductor processing. More particularly, the present claimed invention relates to a novel metal-insulator-metal (MIM) capacitor and a method for forming such a capacitor.

BACKGROUND ART

As semiconductor geometries continue to become smaller and smaller, new difficulties arise in the fabrication of semiconductor devices. As one example, with progressively finer design rules, a problem has arisen due to capacitance between adjacent metal layers (i.e. interlayer capacitance). That is, as devices shrink in size, adjacent layers are spaced more closely together. Such a condition results in a deleterious increase in interlayer capacitance which adversely affects operation of finer design rule-based semiconductor devices. A similar problem exists due to the reduced distance between adjacent metal lines. Specifically, under some circumstances, unwanted effects such as cross-talk and various other RC (resistance/capacitance) delay effects between closely spaced metal lines negatively affect the operation of the semiconductor devices.

In one attempt to reduce such deleterious effects, newer semiconductor fabrication techniques are employing lower resistance metals (e.g. copper) to form many metal elements (e.g. lines, interconnects, and the like). Such newer semiconductor fabrication techniques include, for example, damascene/dual-damascene/multi-damascene processes which readily employ copper metal and which achieve highly desirable results. Unfortunately, copper, as an example, is not readily etched in the manner which conventionally-used aluminum, for example, is etched. As a result, certain structures, such as capacitors, which in the past have been readily formed, at least in-part, by the etching of aluminum, are not compatible with the newer semiconductor fabrication techniques such as, for example, copper damascene/dual-damascene/multi-damascene processes.

When forming huge copper plates, several problems such as dishing, cusping, and erosion occur. For example, using conventional chemical mechanical polishing (CMP), severe dishing may occur when the copper plates are larger than, for example, 8–10 micrometers. Therefore, large copper metal-insulator-metal (MIM) capacitors plates with a dimension larger than, for example, 10 micrometers by 10 micrometers are difficult to form with copper damascene/dual-damascene/multi-damascene processes.

As yet another concern, in order to achieve widespread acceptance, and to ensure affordability, any method of forming a capacitor, which overcomes the above-listed drawbacks, should be compatible with existing semiconductor fabrication processes.

Thus, a need exists for a capacitor and a method for forming the capacitor wherein the capacitor and the formation method are compatible with newer semiconductor fabrication techniques. A further need exists for a capacitor and a method for forming the capacitor wherein the capacitor and the formation method meet the above need and are compatible with existing semiconductor fabrication processes such that significant revamping of semiconductor capital equipment is not required.

SUMMARY OF INVENTION

The present invention provides a capacitor and a method for forming the capacitor wherein the capacitor and the formation method are compatible with newer semiconductor fabrication techniques. The present embodiment further provides a capacitor and a method for forming the capacitor wherein the capacitor and the formation method achieve the above-listed accomplishment and are compatible with existing semiconductor fabrication processes such that significant revamping of semiconductor capital equipment is not required. The present embodiment further provides a capacitor and a method for forming a capacitor with huge copper plates, for example, larger than 100 square micrometers.

In one method embodiment, the present invention recites forming a number of first openings in a first substrate. The present embodiment then recites forming a copper region within each first opening during a damascene process, wherein each copper region has a top surface. The present embodiment then disposes a dielectric layer proximate to the top surface of each of the first copper regions during the damascene process. After depositing a second substrate over the dielectric, a number of second openings in the second substrate are made. Next, a number of second copper regions are formed in the second openings, during the damascene process. The dielectric region is thus disposed between the first copper regions and the second copper regions. In so doing, the dielectric region forms a dielectric barrier between the first copper regions and the second copper regions such that a metal-insulator-metal (MIM) capacitor is formed during a damascene process.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention:

FIG. 3 is a flow chart of steps performed in accordance with one embodiment of the present claimed invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
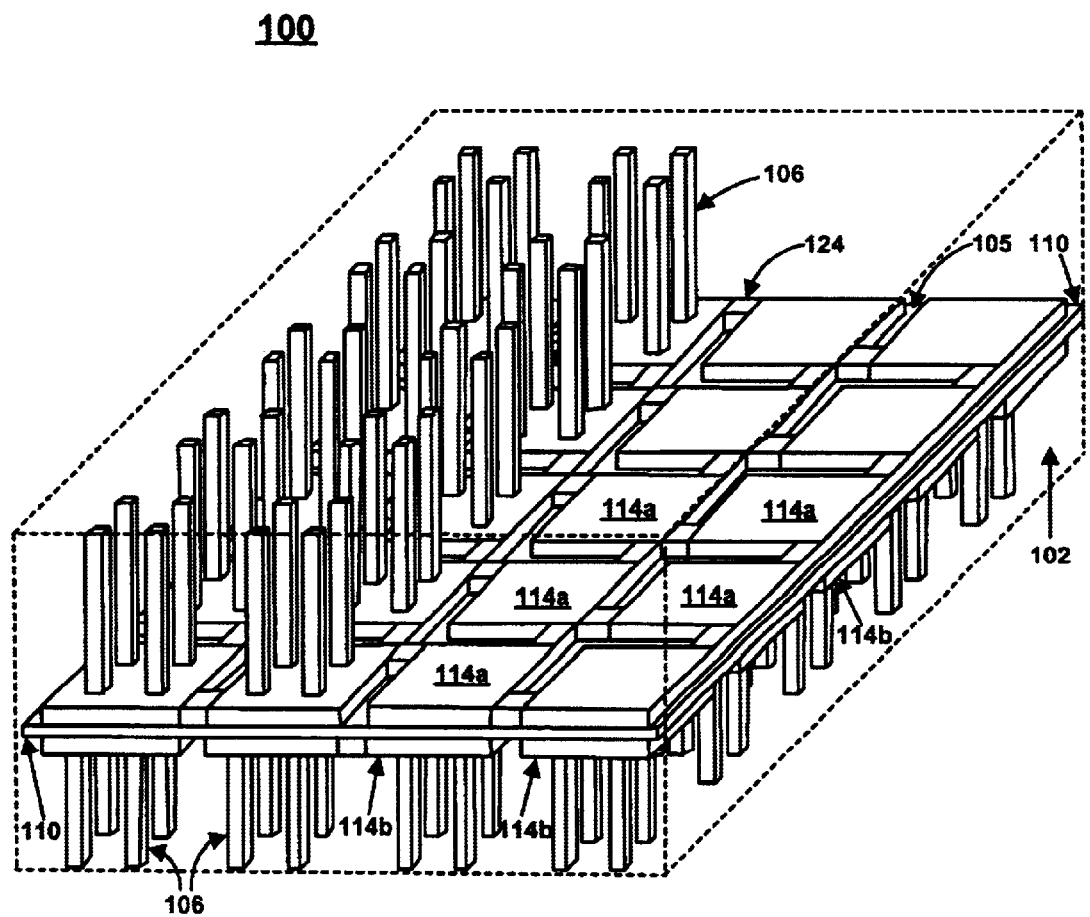
FIG. 1 is a perspective view of a metal-insulator-metal capacitor, in accordance with one embodiment of the present claimed invention.

FIG. 1 is a perspective view of an embodiment of the present invention, a metal-insulator-metal capacitor 100 formed in a damascene process. The capacitor 100 has a substrate of inter-metal dielectric 102 (e.g. low-k dielectric material), in which the copper electrodes or plates 114 and copper interconnects 106 are formed, via a damascene or dual damascene process. The gaps 105 between the electrode plates 114 comprise the low-k dielectric material 102. Additionally, the small copper electrode plates 114 are electrically connected by metal regions 124. However, it is not required that the copper electrode plates be connected together. Because of the low reflectivity of the low-k dielectric 102, the copper electrode plates 114 may be developed close together. A high k dielectric material 110 resides between the copper electrode plates 114. Preferably, the high-k dielectric 110 overlaps the bottom and top copper electrode plates 114, as is seen by the slight overlap along the edge of the capacitor 100. The dielectric 110 may be one continuous piece; however, this is not required. For example, there may be gaps in the dielectric 110 corresponding substantially with the gaps 105 between the copper electrode plates 114. The top 114a and bottom copper electrode plates 114b may be formed in pairs, wherein each member of the pair is substantially the same size and shape as the other. However, it is not required that there be an equal number of top 114a and bottom copper electrode plates 114b nor that the top 114a and bottom copper electrode plates 114b are paired together with each member having a similar size and shape. Furthermore, while FIG. 1 illustrates an array of copper electrode plates 114, the present invention is well suited to other geometries of multiple copper electrode plates 114 effectively forming a larger capacitor plate.

FIGS. 2A–2H provide side sectional views of the structures created according to embodiments of the method of the present invention as set forth in the flow chart of FIG. 3. For purposes of clarity, the following discussion will utilize the side sectional views of FIGS. 2A–2H in conjunction with the flow chart of FIG. 3 to clearly describe the embodiments of the present invention. As will be described in detail below, the method and apparatus of the present invention deal with a novel metal-insulator-metal (MIM) copper capacitor. Furthermore, although the following discussion and examples specifically describe a novel copper MIM capacitor and formation method thereof, the present invention is also well suited to use with metals other than copper. Furthermore, the present invention is well suited to forming a metal-oxide-metal (MOM) capacitor.

Figure 2A:
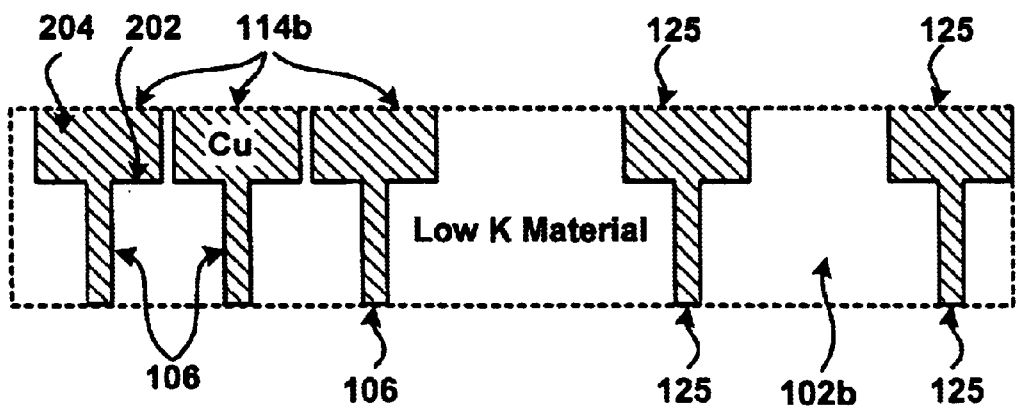
FIGS. 2A–2H are side sectional view of structures illustrating various formation process steps utilized in conjunction with the formation of a novel capacitor in accordance with one embodiment of the present claimed invention.

With reference now to FIG. 2A and to step 302 of FIG. 3, in the present embodiment, a substrate 102b as shown in FIG. 2A is comprised of a material such as, for example, an inter-metal dielectric (IMD) material. In one embodiment, the IMD is comprised of a material such as, for example, silicon dioxide. Although such an IMD material is recited in the present embodiment, the present embodiment is well suited to the use of any other material into which it is desired to form the present novel MIM capacitor. More importantly, steps of the method embodiments of the present invention occur within a damascene process flow. That is, the present novel copper capacitor is formed during, and using fabrication methods which are compatible with, a damascene, dual-damascene, or multi-damascene process flow. The present invention is not, however, limited solely to use with a dual-damascene process flow. Furthermore, in the present embodiment, the formation of first metal regions 114b are accomplished during, or in a similar manner to, the formation of various other metal structures (e.g. metal regions 125) fabricated for various other purposes during a damascene or dual damascene process.

With reference now to step 302 of FIG. 3, the present embodiment forms a number of metal electrode regions 114b and interconnects 106 during a dual damascene process, along with the formation of various other trenches/openings. In FIG. 2A, the copper metal regions 114b, which comprise the top of the "T" structures on the left, will form the bottom capacitor electrode plates 114b of the MIM capacitor. The lower part of the "T" structures on the left will form the capacitor interconnects 106. The two metal regions to the right will be other interconnects. The interconnects 106 and the capacitor electrodes 114 may be formed during different steps of the dual damascene process. It will be understood that any number of copper regions 114 may be used to combine to form the MIM capacitor.

Step 302 of FIG. 3 is illustrated in FIG. 2A. In the present embodiment, first a number of openings 204 are made in the substrate 102b. In a damascene process, a liner material 202 (e.g. tantalum, tantalum nitride, titanium nitride, or the like) is used to prevent subsequently deposited metal (such as copper) from contaminating substrate 102b. In the present embodiment, layer 202 is comprised of a few tens to a few hundreds Angstroms of liner material (e.g., approximately 50–200 Angstroms). However, the present invention is well suited to other thicknesses. Then the openings 204 are filled with metal. The present invention is well suited to blanket deposition, electrodeless, or electrolyte processes. In one embodiment, the barrier layer 202 is covered with a top layer, of approximately a few hundred Angstroms, of seed material (i.e. a layer of the material to be subsequently electroplated into openings 204).

Next, in step 304 of FIG. 3, the present embodiment then removes excess metal (using, for example a planarization method such as chemical mechanical polishing (CMP)). The surface area of each copper metal region 114, which are the electrode plates of the MIM capacitor 100, is small enough to avoid the deleterious effects of problems such as, for example, dishing, cusping, and erosion. However, together the copper metal regions 114 form a large region. For example, a copper region of substantially over 100 square micrometers may be formed, in a damascene or dual-damascene process.

Figure 2B:
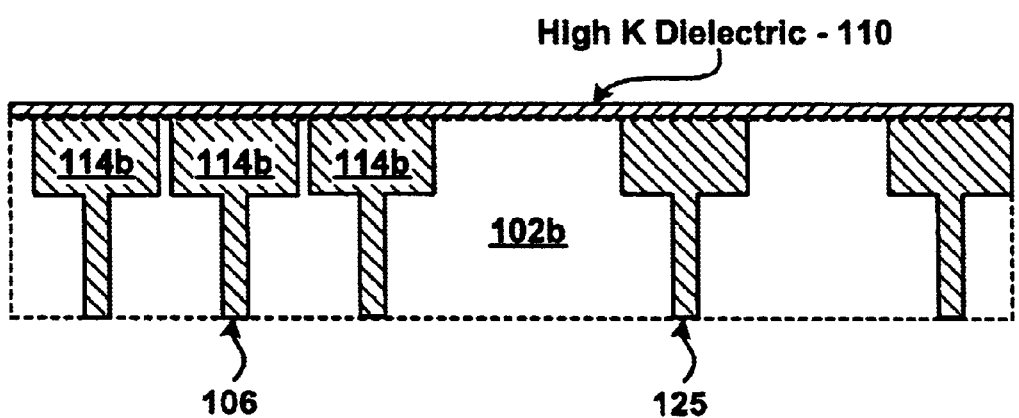

As shown in FIG. 2B, step 306 a dielectric material 110 is deposited over the top or exposed surface of the metal regions 114, as well as other regions. Deposits of 100 Angstroms to several thousand Angstroms may be used, depending on the capacitance desired. However, the present invention is well suited to other thicknesses. More specifically, as shown in FIG. 2B, in the present embodiment, the present method deposits a layer of high k dielectric material 110 above the structure of FIG. 2A. The high k dielectric material may be, for example, silicon nitride, tantalum oxide, or any refractory oxide/nitride. Furthermore, the high k dielectric may be an organic high k dielectric. More generally, any material which is a high k dielectric and is compatible with the copper backend process may be used. Furthermore, in the present embodiment, the deposition of the high k dielectric material 110 is accomplished during, or in a similar manner to, the deposition of dielectric material for various other purposes during a damascene process.

Figure 2C:
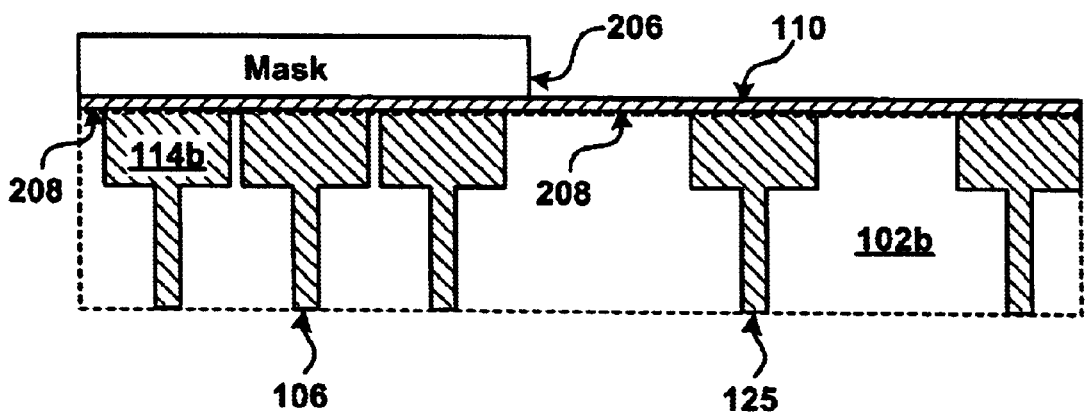

Continuing with step 308 of FIG. 3, FIG. 2C illustrates that the present embodiment then subjects the structure of FIG. 2B to an etching process to remove certain portions of high k dielectric material 110 disposed thereon. In this step of the present embodiment, a layer of photosensitive material (e.g. photoresist 206) is deposited and patterned. The photoresist mask 206 may be placed entirely over the area which forms the bottom electrode plates 114 of the MIM capacitor 100. Preferably, a small overlap 208 may be created. In this fashion a high k dielectric layer 110 for the MIM capacitor 100 is formed. In one embodiment of the present invention, the removal of the high-k dielectric 110 is performed using a reactive ion etching (RIE) process. The present invention is not, however, limited to the use of such an etching process to remove portions of high k dielectric material 110.

Figure 2D:
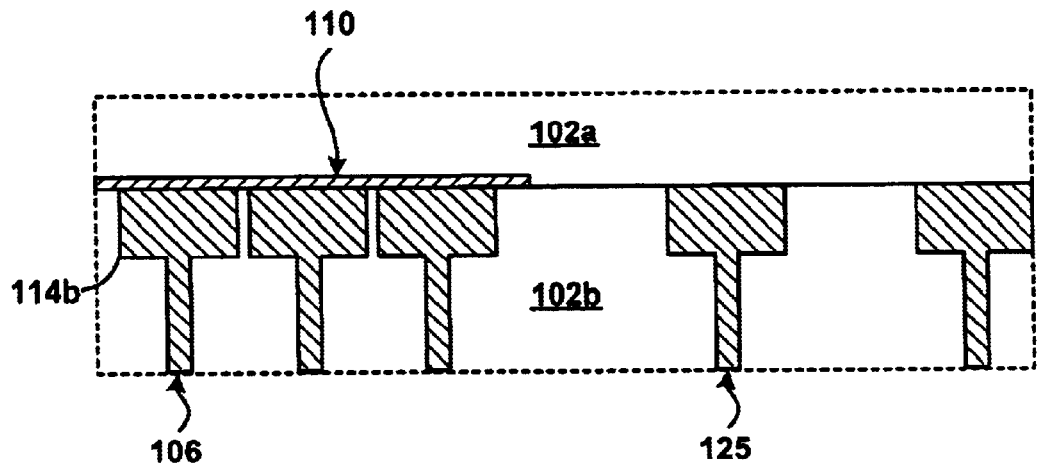
Figure 2E:
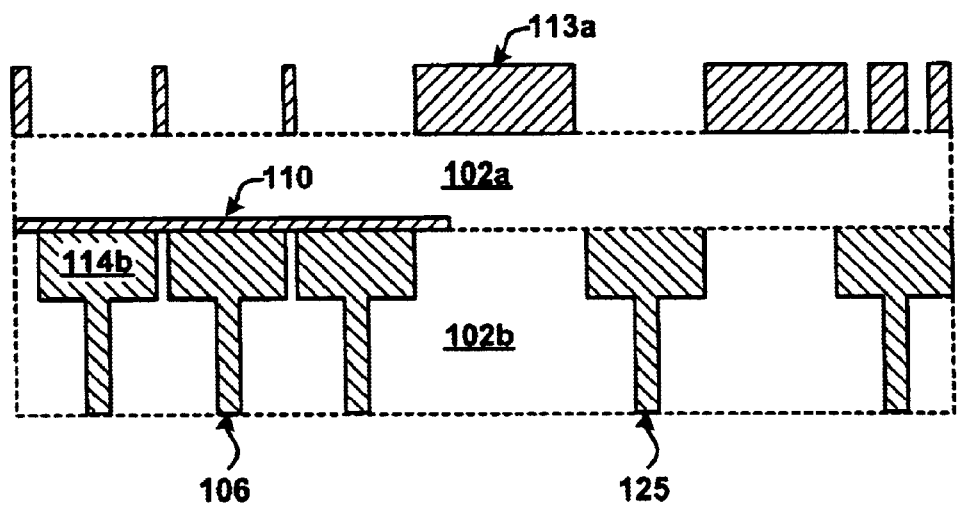

With reference now to step 310 of FIG. 3 and FIGS. 2D–2E, the present embodiment deposits a second low-k IMD layer 102a. The layer 102a may be deposited by, for example, Fluorine Spin-on-Glass (FSG), Spin-on-Glass (SOG), undoped Spin-on-Glass (USG), etc. A mask 113a is shown in FIG. 2E. Then, the present embodiment masks and patterns to form the top capacitor electrode plates 114a and capacitor interconnects 106 simultaneously with the other interconnects.

Figure 2F:
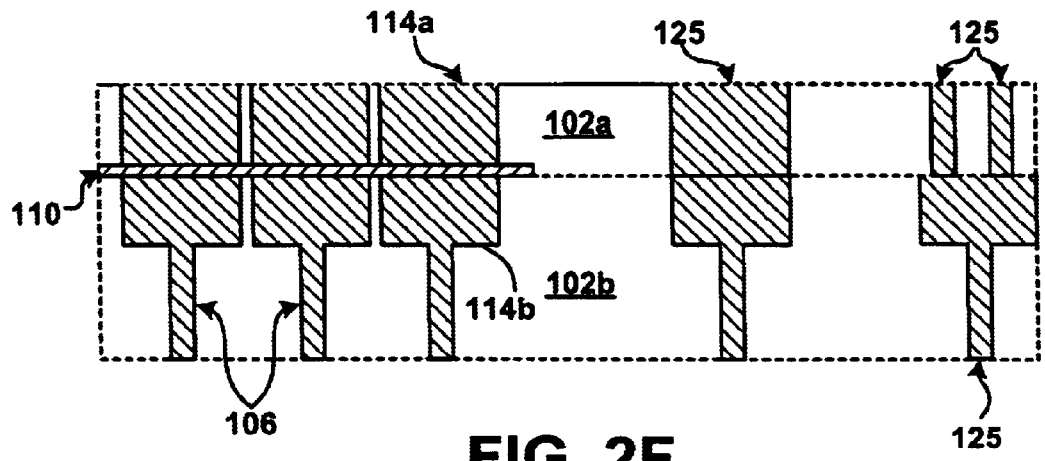

With reference now to step 312 of FIG. 3 and FIG. 2F, the present embodiment forms the top capacitor electrode plates 114a and interconnects 106 by depositing a barrier of Tantalum or Tantalum Nitride ($Ta_xN_y$) and filling the trends/via with copper. As mentioned above, in a damascene process, a liner material (e.g. tantalum, tantalum nitride, titanium nitride, or the like) is used to prevent subsequently deposited metal (such as copper) from contaminating substrate 102a. In the present embodiment the barrier is again comprised of approximately 50–200 Angstroms of liner material. However, the present invention is well suited to other thicknesses. In one embodiment, a top layer, of approximately a few hundred Angstroms, of seed material (i.e. a layer of the material to be subsequently electroplated into opening 104) is deposited on the barrier. The multiple second metal regions 114a are formed on top of the high k dielectric region 110 with high k dielectric region 110 disposed between first metal region 114b and the second metal region 114a. In so doing, a dielectric barrier is formed between first metal regions 114b and the second metal regions 114a such that a MIM capacitor 100 is formed. As with the bottom electrode plates 114b, the top copper metal regions 114a form the numerous smaller top capacitor electrode plates 114a, which may be joined by metal regions 124 to form one large plate. It will be understood that the FIGS. 2A–2H only show a cross section of the MIM capacitor 100; therefore, numerous metal regions 114 are not shown.

With reference now to step 314 of FIG. 3, the present embodiment then removes excess metal (using, for example a planarization method such as chemical mechanical polishing (CMP)), such that the top electrode plates 114a are formed on top of high k dielectric region 110 with high k dielectric region 110 disposed between top electrode plates 114a and bottom electrode plates 114b. Furthermore, in the present embodiment, the formation of second metal regions 114a are accomplished during, or in a similar manner to, the formation of various other metal structures (e.g. metal regions 125) fabricated for various other purposes during a damascene or dual damascene process.

Figure 2G:
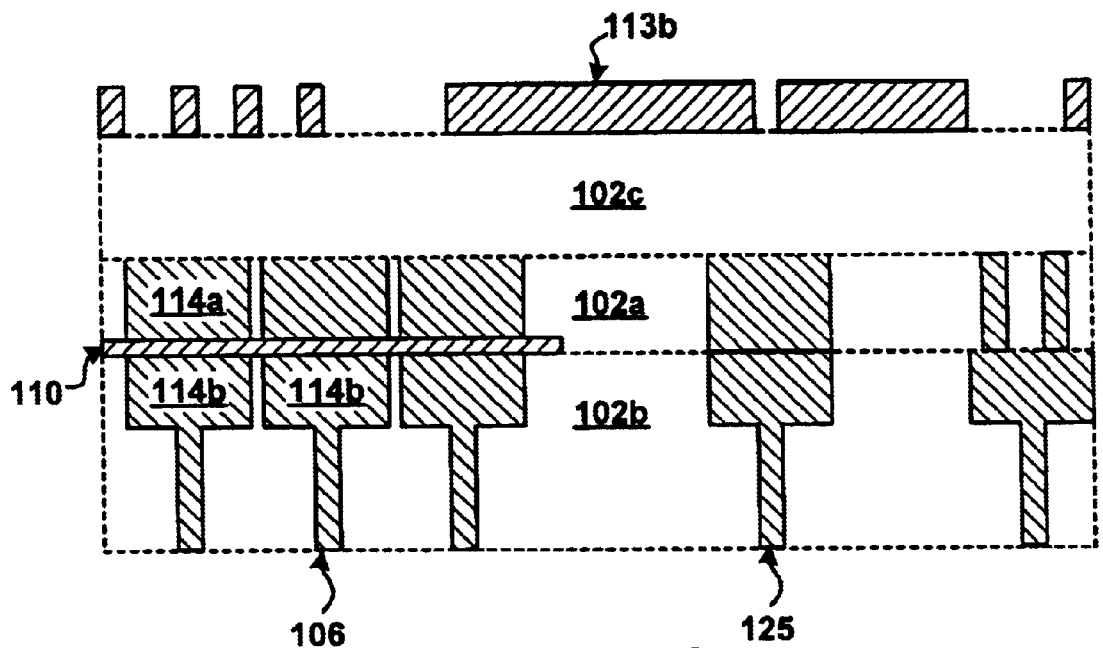
Figure 2H:
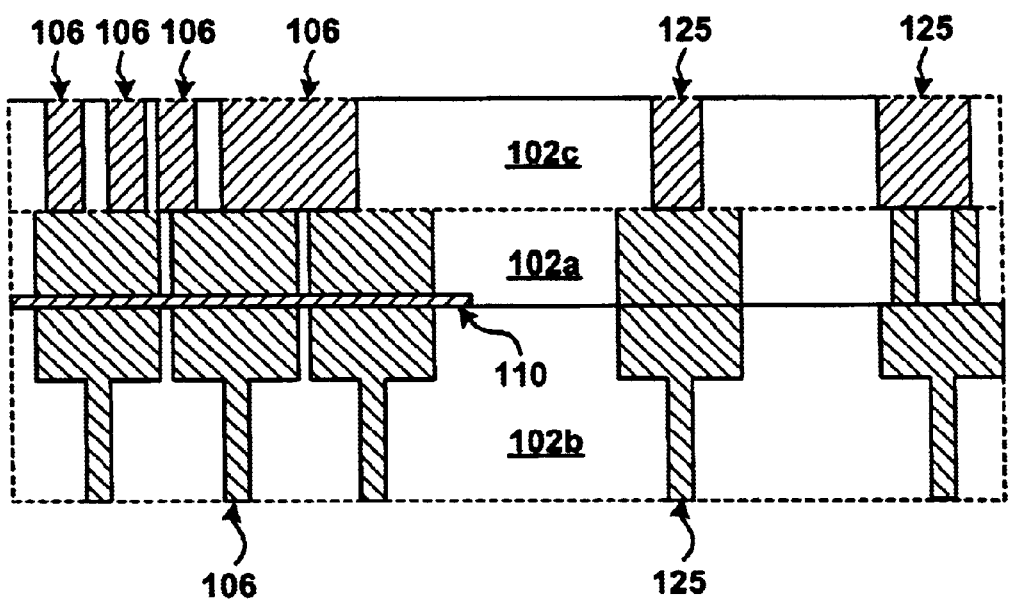

With reference now to step 316 of FIG. 3, and FIGS. 2G–2H, the circuit in completed by forming interconnects or links 106, as per conventional dual damascene MIM or MOM processing. In this step, an additional substrate 102c may be deposited over the structure of FIG. 2F. A mask 113b is shown in FIG. 2G.

Beneficially, the structures and formation methods of the present embodiments are realized using existing semiconductor fabrication processes such that significant revamping of semiconductor capital equipment is not required. As a result, the present embodiments do not require significant costs to implement.

Thus, the present invention provides a capacitor and a method for forming the capacitor wherein the capacitor and the formation method are compatible with newer semiconductor fabrication techniques. The present embodiment further provides a capacitor and a method for forming the capacitor wherein the capacitor and the formation method achieve the above-listed accomplishment and are compatible with existing semiconductor fabrication processes such that significant revamping of semiconductor capital equipment is not required. The present invention further provides a capacitor formed in a damascene process with copper that may be substantially larger than 100 square micrometers.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

We claim:

1. A method for forming a MIM capacitor during a multi-damascene process, said method comprising the steps of:
   a) forming a first capacitor electrode comprising a first plurality of metal regions during a first damascene process, each of said first plurality of metal regions having a top surface;
   b) disposing a dielectric region proximate to said top surfaces of said first plurality of metal regions; and
   c) forming a second capacitor electrode comprising a second plurality of metal regions during a second damascene process on top of said dielectric region with said dielectric region disposed between said first plurality of metal regions and said second plurality of metal regions such that said MIM capacitor is formed during said multi-damascene process.

2. The method as recited in claim 1 wherein said step a) comprises the step of:
   a1) forming said first plurality of metal regions with a gap between the sides of said first plurality of metal regions.

3. The method as recited in claim 1 wherein step a) comprises the step of:
   a1) forming a plurality of coupling metal regions to couple ones of said first plurality of metal regions during said first damascene process.

4. The method as recited in claim 1 wherein step a) comprises the step of:
   a1) forming said top surfaces such that they are substantially in the same plane.

5. The method as recited in claim 1 wherein step a) comprises forming said first plurality of metal regions of copper.

6. The method as recited in claim 5 wherein step a) comprises removing excess copper by chemical mechanical polishing (CMP).

7. The method as recited in claim 1 wherein said dielectric is selected from the group consisting of silicon nitride and tantalum oxide.

8. The method as recited in claim 1 wherein step c) comprises the step of:
- c1) forming each of said second plurality of metal regions to correspond to one of said first plurality of metal regions, wherein pairs of metal regions are formed with each member of the pair having substantially the same size and shape.

9. A method for forming a metal insulator metal (MIM) copper metal-containing capacitor during a multi-damascene process, said method comprising the steps of:
- a) forming a first plurality of openings in a first substrate,
- b) forming a first capacitor electrode comprising a first plurality of copper regions within said first plurality of openings during a first damascene process, said plurality of copper regions each having a top surface and at least one side surface, wherein the sides of said plurality of copper regions are separated by said first substrate;
- c) disposing a dielectric layer on top of said top surfaces of said first plurality of copper regions;
- d) forming a second plurality of openings in a second substrate on top of said dielectric layer; and
- e) forming a second capacitor electrode comprising a second plurality of copper regions within said second plurality of openings during a second damascene process, with said dielectric layer disposed between said first plurality of copper regions and said second plurality of copper regions and forming a dielectric barrier between said first plurality of copper regions and said second plurality of copper regions such that said MIM capacitor is formed.

10. The method as recited in claim 9 wherein step a) comprises the step of:
- a1) forming said first plurality of openings in an inter-metal dielectric (IMD) material, which is a low-k dielectric relative to said dielectric region disposed between said first and said second plurality of copper regions, wherein the sides of said first plurality of copper regions are separated by said inter-metal dielectric (IMD) material.

11. The method as recited in claim 10 wherein step b) comprises the step of:
- b1) forming a plurality of coupling metal regions to couple ones of said first plurality of copper regions during said first damascene process, such that said ones of said first plurality of copper regions are electrically connected.

12. The method as recited in claim 9 wherein step c) comprises disposing said layer of high k dielectric material selected from the group consisting of silicon nitride and tantalum oxide.

13. The method as recited in claim 1, further comprising:
- forming a first plurality of interconnects coupled to ones said first plurality of metal regions; and
- forming a second plurality of interconnects coupled to ones said second plurality of metal regions.

* * * * *